US005925856A

United States Patent [19]

Meyer et al.

[11] Patent Number: 5,925,856

[45] Date of Patent: Jul. 20, 1999

[54] LOUDSPEAKER HORN

[75] Inventors: John D. Meyer; Alejandro Antonio Garcia Rubio, both of Berkeley, Calif.

[73] Assignee: Meyer Sound Laboratories Incorporated, Berkeley, Calif.

[21] Appl. No.: 08/877,443

[22] Filed: Jun. 17, 1997

Related U.S. Application Data

[60] Provisional application No. 60/019,866, Jun. 17, 1996.

[51] Int. Cl.[6] .......... H05K 5/00

[52] U.S. Cl. .......... 181/152; 181/187; 181/192

[58] Field of Search .......... 181/152, 159, 181/182, 187, 192, 195; 381/156

[56] References Cited

U.S. PATENT DOCUMENTS

| | | | |
|---|---|---|---|
| 3,930,561 | 1/1976 | Klayman | 181/192 |
| 4,071,112 | 1/1978 | Keele, Jr. | 181/187 |
| 4,176,731 | 12/1979 | Sinclair . | |
| 4,187,926 | 2/1980 | Henricksen et al. . | |
| 4,206,831 | 6/1980 | Welch et al. | 181/159 |
| 4,390,078 | 6/1983 | Howze et al. . | |
| 4,465,160 | 8/1984 | Kawamura et al. | 181/192 |
| 5,285,025 | 2/1994 | Yoshioka | 181/192 |

*Primary Examiner*—Khanh Dang
*Attorney, Agent, or Firm*—Donald L. Beeson

[57] ABSTRACT

A loudspeaker horn for use with an acoustical driver has a rectangular throat opening with a long dimension relative to the wavelength of the sound pressure waves generated within the high frequency range of the horn. A relatively short pre-load chamber corrects the phase of the sound pressure waves over the long dimension of the throat opening. The pre-load chamber provides control over the directivity of the horn and provides a uniform frequency response with minimal distortion.

12 Claims, 6 Drawing Sheets

LOUDSPEAKER HORN

CROSS-REFERENCE TO RELATED APPLICATIONS

This application claims the benefit of U.S. Provisional application Ser. No. 60/019,866, filed Jun. 17, 1996.

BACKGROUND OF THE INVENTION

The present invention generally relates to loudspeaker horns, and more particularly to the problem of designing a loudspeaker horn having uniform horizontal and vertical polar frequency responses.

One of the main problems associated with loudspeaker horns is the difficulty of designing the horn to provide uniform horizontal and vertical polar frequency responses over the horn's operating frequencies. This difficulty leads to "beaming" and high frequency on-axis drop-out associated with horn loaded loudspeakers. In other words, the horn may behave in a desired fashion and provide desired coverage at certain frequencies but degrade markedly at other frequencies, resulting in a poor overall performance. These performance problems can be traced to the failure of conventional designs to provide the phase correction necessary at the mouth of the horn to achieve a desired uniform frequency response. They exist in a variety of horn designs including exponential horns, multicell horns and sectional horns.

In pure exponential horns, the driver mechanism of the speaker couples to a narrow unobstructed throat area of the horn which is typically small in relation to the wavelength of the frequencies at which the speaker operates such that no phase correction is possible at the mouth end of the horn. Multicell and sectional horns provide a variety of vane and cell structures intended to improve the directivity and some improvement to phase control, but the introduction of vanes or cellular structures into the throat area of the horn tends to introduce undesirable ripples in the frequency response. U.S. Pat. Nos. 4,390,078 to Howze et. al. and 4,685,532 to Gunness disclose examples of rectangular horns employing one or more vanes intended to provide constant coverage angles and eliminate interference related to high frequency drop-out, but for reason mentioned above generally produce unsatisfactory results in terms of frequency response uniformity.

Yet another problem associated with some conventional horn designs is illustrated in U.S. Pat. No. 4,187,926 to Henricksen et. al. Henricksen discloses a horn having an elongated throat area having a short dimension relative to the wavelengths of the high frequencies at which the horn operates. This length will introduce distortion to the sound wave as it passes through the throat area. Generally, the throats found in many early horn designs have lengths that are many times the wavelength of their high operating frequencies with the serious distortive effect.

The present invention provides an loudspeaker horn structure and a method for coupling sound pressure waves from an acoustical driver into free space which achieves substantial uniformity in the horn's frequency response and which substantially reduces the problem of beaming and high-frequency drop-out associated with conventional horn designs. The loudspeaker horn of the present invention also provides a horn design which has a relatively short dimensions at the throat end of the horn, resulting in reduced distortion after introduced into this section of the horn.

SUMMARY OF INVENTION

Briefly, the invention involves a loudspeaker horn for coupling sound pressure waves generated by an acoustical driver into free space over an operating band width of frequencies including a high range of operating frequencies having known wavelengths. The horn produces a characteristic polar pattern about a radiating axis to provide desired vertical coverage and horizontal coverage.

Briefly, the loudspeaker horn of the invention is comprised of an obstructed throat area having a defined rectangular throat opening characterized by at least one long dimension relative to the wavelengths of the high range of operating frequencies of the horn. The long dimension of the throat opening is measured between long dimension defining edges of the throat opening, and this long dimension generally defines a long dimension plane within the polar pattern of the loudspeaker horn. By providing a long dimension relative to the wavelengths of the high range of operating frequencies of the horn, the pressure wave can be preconditioned such that it's phase at the throat opening is corrected to provide greater control over the frequency directivity in the long dimension plane of the polar pattern.

Suitably, the direction of the throat opening perpendicular to the long dimension is characterized by a short dimension relative to the wavelength of the highest frequency of the horn's operating frequencies. By providing a short dimension that is generally less than one wavelength, the throat opening in the short dimension will act as a diffraction slit for the sound pressure waves passing through it whereby the frequency directivity of the horn in the plane of the polar pattern perpendicular to the long dimension plane will be governed substantially by the flared characteristics of the horn. It will be understood that the throat opening of the horn could be provided with two long dimensions whereby frequency directivity control can be governed in both planes of the horn's polar pattern by preconditioning the signal across both dimensions of the throat openings.

Preconditioning the sound pressure waves at the rectangular throat opening is accomplished by a pre-load chamber through which the acoustic driver is coupled to the rectangular throat opening of the horn. The pre-load chamber has a length measured from the acoustical driver to the throat opening of the horn that is relatively short in relation to multiples of the wavelengths of the highest operating frequency of the horn. Generally, a pre-load chamber having a length that is less than approximately five inches will achieve the objective of minimizing distortion while permitting suitable phase correction at the horn's rectangular throat opening. The pre-load chamber is internally formed to correct the phase relationship of the sound pressure waves generated by the acoustical driver across the long dimension of the horn's throat opening to achieve desired directivity in the long dimension plane of the horn's polar pattern. Designing the pre-load chamber to achieve the desired result is accomplished by experimentally selecting a curvature for the sidewalls of the pre-load chamber associated with the long dimension of the throat opening. Examples of pre-load chamber design are described in the following description of the illustrated embodiment.

The horn additionally has a flared section extending between the throat opening and the mouth end of the horn. This flared section has a pair of opposed long dimension side walls extending from the long dimension defining edges of the throat opening of the horn in a characteristic curve, which, in conjunction with the form of the pre-load chamber, is selected to achieve desired directivity of the horn's polar pattern in the long dimension plane. The pre-load chamber and flared section of the horn can be designed in conjunction with one another to achieve desired directivity characteristics in the long dimension of the polar pattern with a uniform frequency response.

Therefore, it is a primary objective of the present invention to provide a loudspeaker horn which can provide uniform frequency response characteristics. It is a further object of the invention to provide a loudspeaker horn which reduces distortion associated with long, narrow throat areas. Further objects of the invention will be apparent from the following specification claims.

DESCRIPTION OF THE ILLUSTRATED EMBODIMENT

Figure 1:
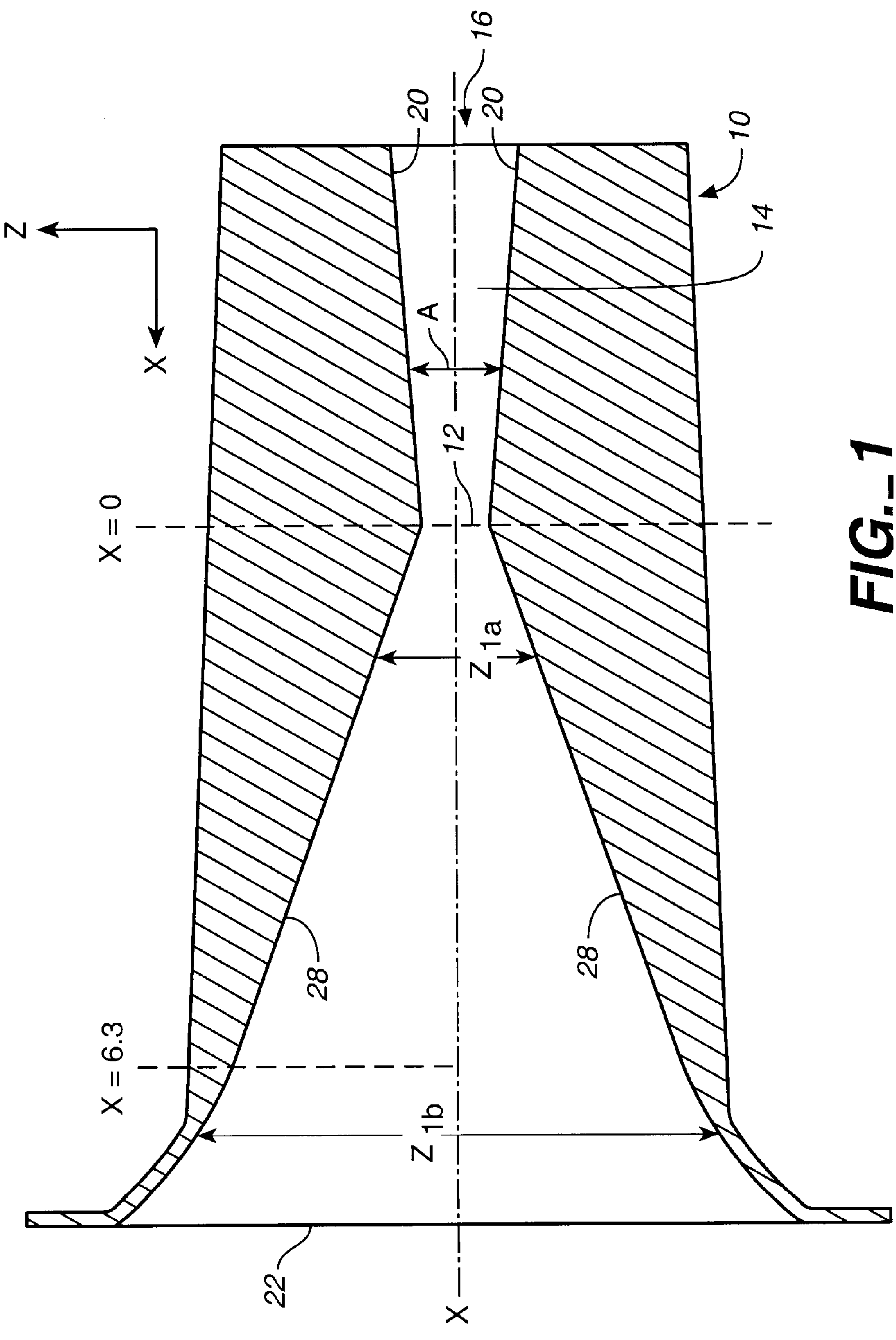
FIG. 1 is a vertical cross-section of a narrow coverage loudspeaker horn along the main axis according to this invention.
Figure 2:
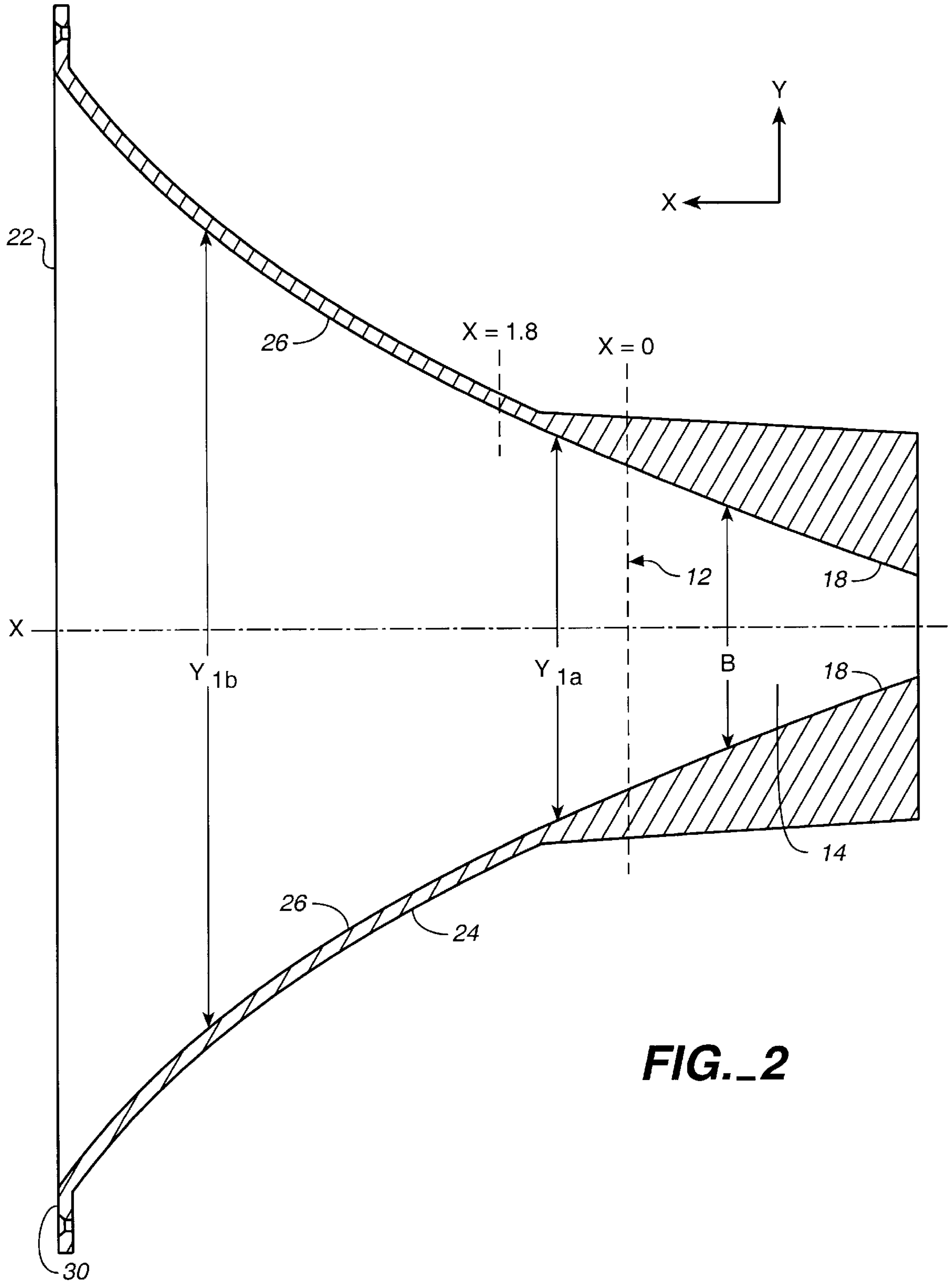
FIG. 2 is a horizontal cross-section of the same narrow coverage loudspeaker horn along the main axis according to this invention.
Figure 3:
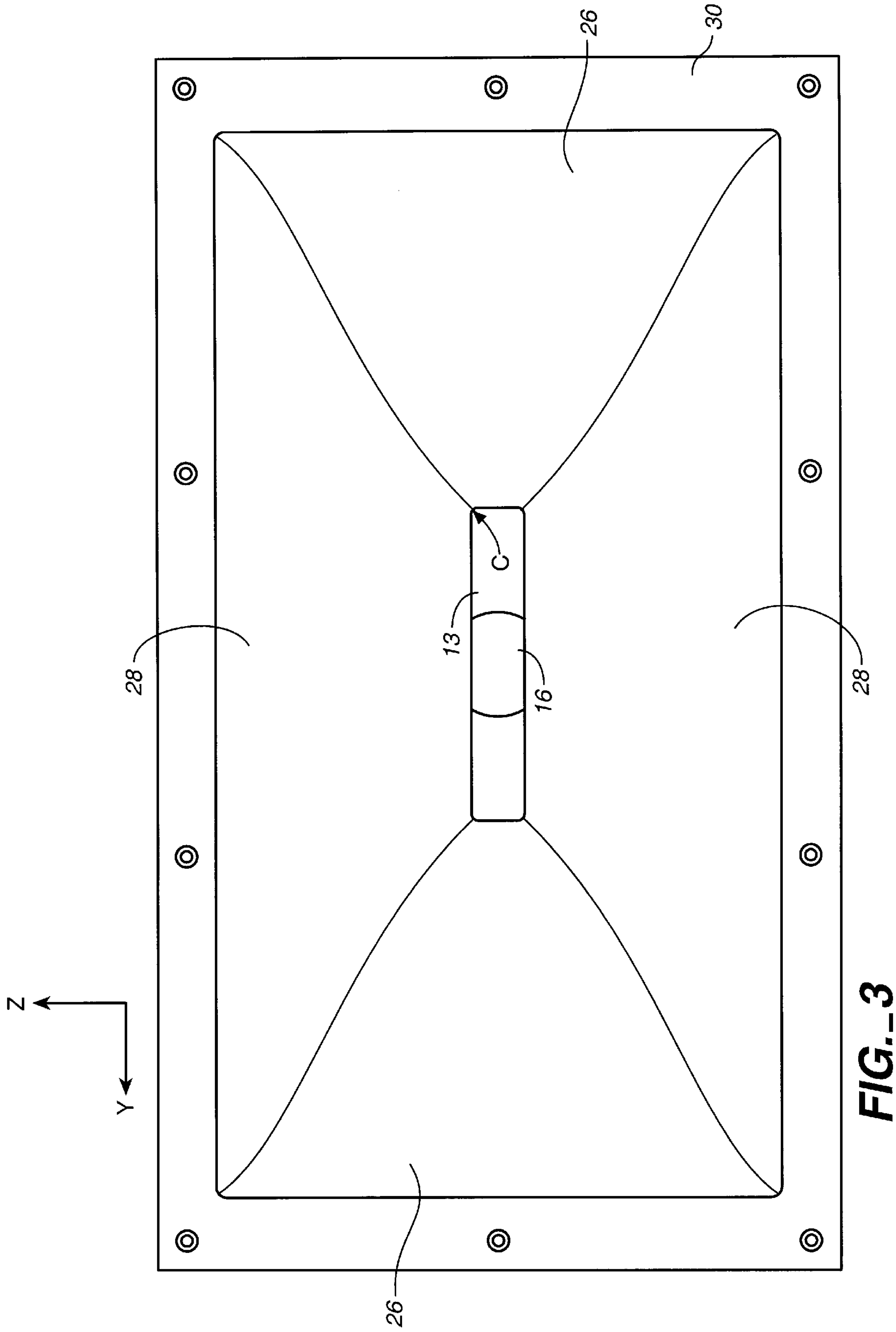
FIG. 3 is a front elevation of a narrow coverage loudspeaker horn according to this invention.
Figure 4:
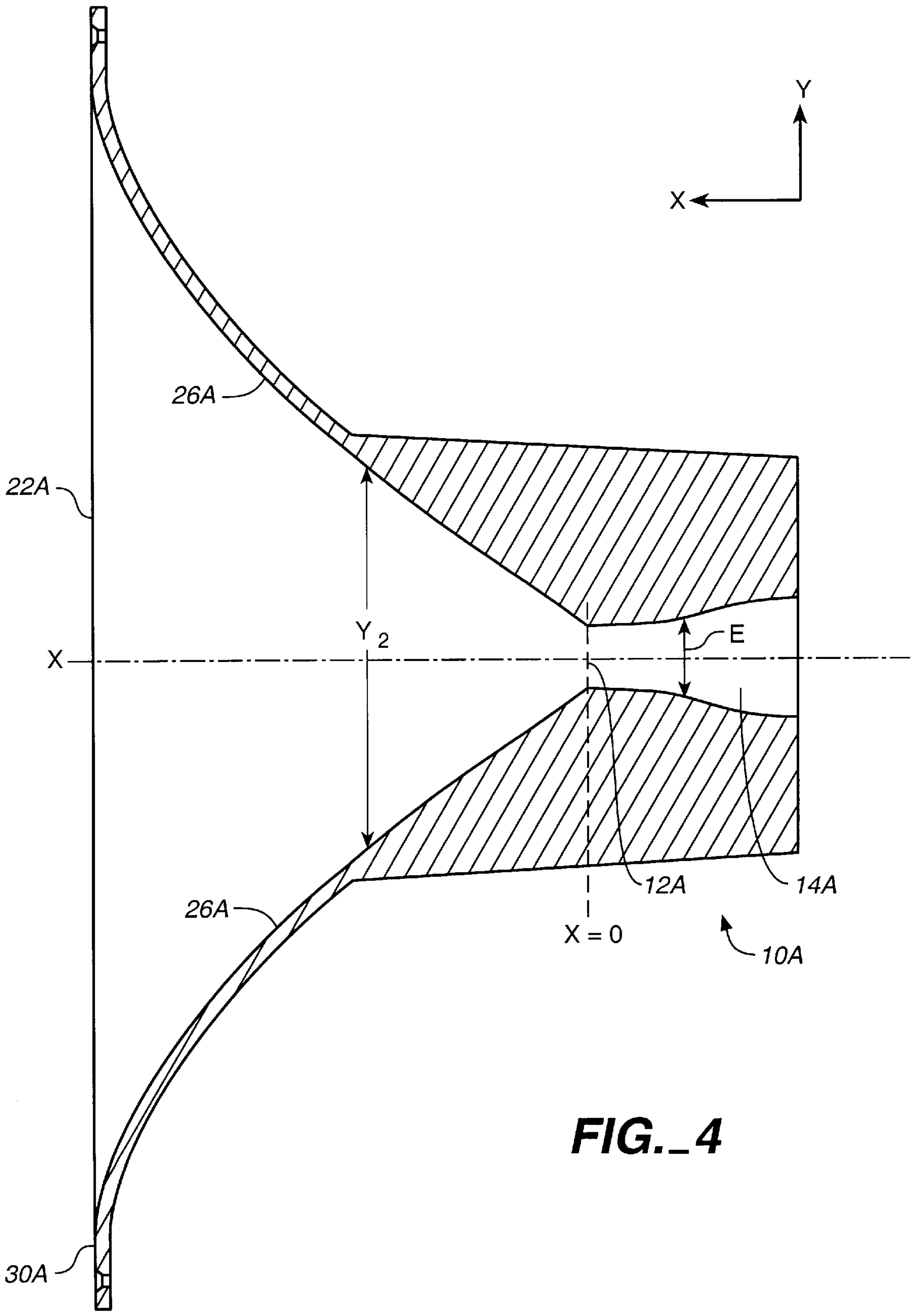
FIG. 4 is a horizontal cross-section of a wide coverage loudspeaker horn along the main radiating axis according to this invention.
Figure 5:
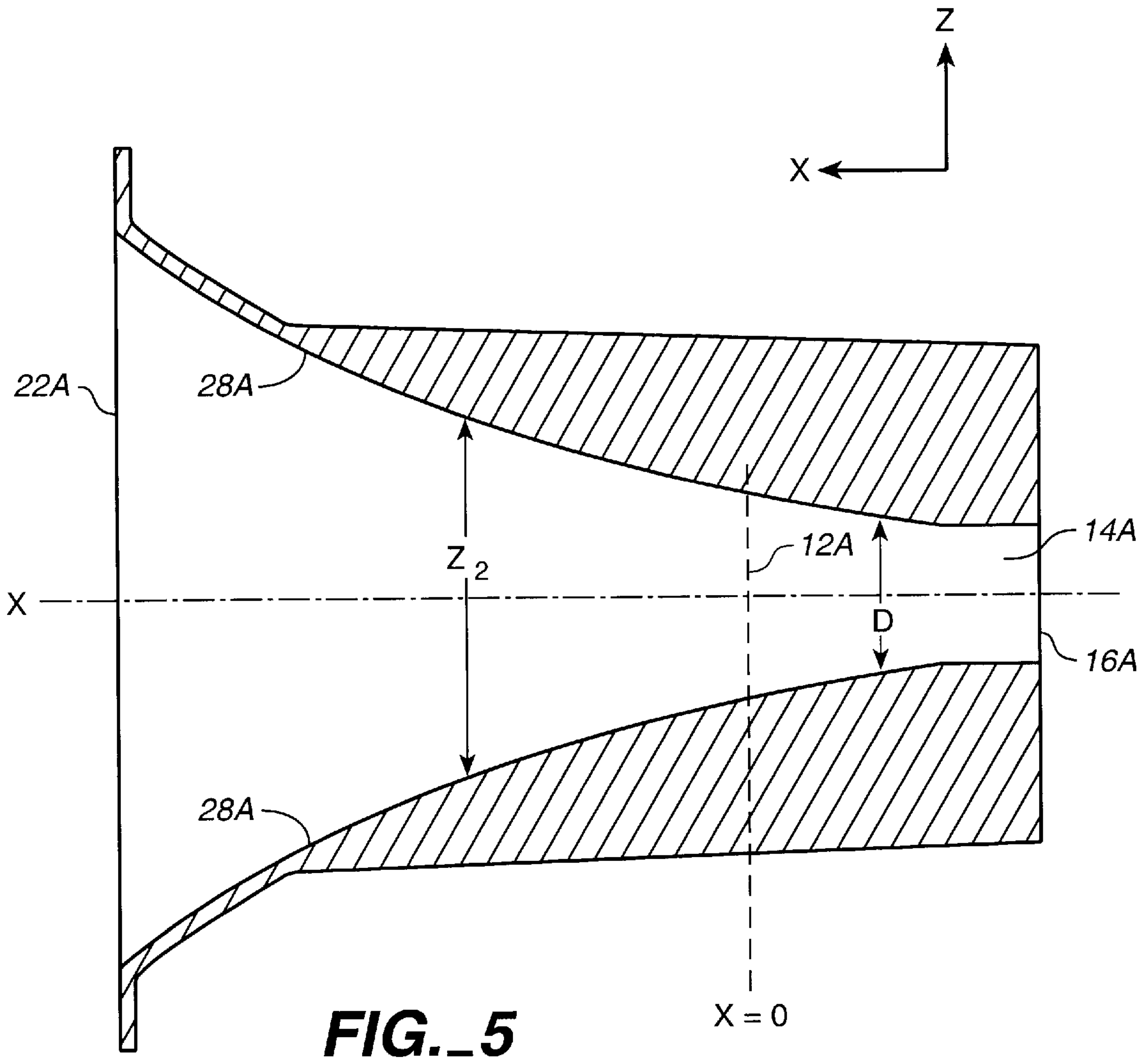
FIG. 5 is a vertical cross-section of a wide coverage loudspeaker horn along the main axis according to this invention.
Figure 6:
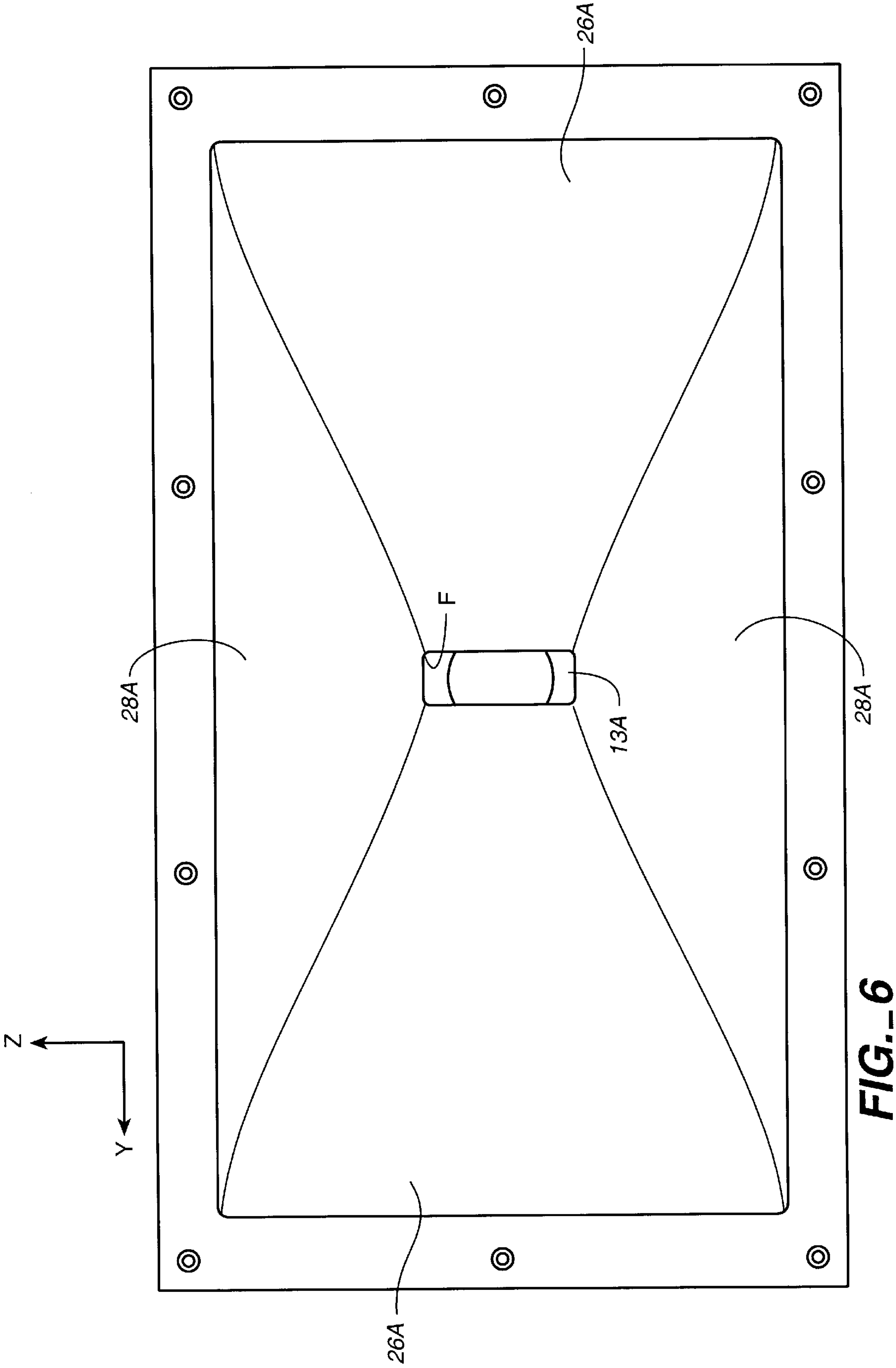
FIG. 6 is a front elevation of a wide coverage loudspeaker horn according to the invention.

Referring now to the drawings, two working embodiments of the loudspeaker horn of the invention are disclosed. The first embodiment is a narrow coverage horn which is illustrated in FIGS. 1–3. The second embodiment of the invention is a wide coverage horn. This embodiment is shown in FIGS. 4–6. In both embodiments, the sound pressure waves generated by an acoustical driver coupled to the horn is conditioned by a pre-load chamber before it reaches the throat of the horn. As will be discussed, the pre-load chamber is designed in conjunction with the flared section of the horn to achieve desired directivity. The pre-load chamber is also provided with a relatively short dimension in terms of the number of wave lengths that can exist in the chamber at the highest frequencies at which the horn operates. By limiting the length of the pre-load chamber, distortion introduced between the driver and the mouth of the horn will be minimized.

Referring to FIGS. 1–3, there is shown a loudspeaker horn 10 having a flared section 11 and a throat area 12 in which there is a defined rectangular throat opening 13. A pre-load chamber 14 is seen to extend between a circular opening 16 at the horn's base end 19 to the horn's throat opening 13. Between the base end 19 and throat opening 13, the pre-load chamber gradually transitions from the circular shape of base opening 16 to the rectangular shape of the horn's rectangular throat opening. As this transition occurs, the horizontal and vertical sidewalls 18, 20 of the pre-load chamber gradually transition from a circular to a planar geometry. As discussed below, the transition of these sidewalls will be designed to correct the phase of the sound pressure waves at the throat opening to achieve desired directivity and frequency response characteristics.

The horn shown in FIGS. 1–3 is further described in reference to the "x," "y," and "z" axis shown by the x, y, z coordinates in FIGS. 1–3. The horn is symmetrical about the x-axis which generally defines the radiation axis of the horn, while the z-axis represents vertical and the y-axis horizontal.

The throat opening 13 shown in FIG. 3 lies in the y-z plane, and is seen to have a long dimension extending in the horizontal y-axis direction between the long dimension defining edges 15 of the throat opening. In the vertical z direction, the throat opening is characterized by a short dimension measured between the throat opening's short dimension defining edges 17. The long dimension of the throat opening is long in relation to the high range of operating frequencies of the horn such that, within the high frequency range, the throat opening will be several wavelengths long. The short dimension, on the other hand, is selected so that it is short in relation to the wavelength of these same high frequencies such that the throat opening effectively behaves like a diffraction slit in the vertical dimension. Due to this throat opening geometry, the directivity of the horn in the x-z vertical plane will be governed strictly by the geometry of the flared section of the horn. On the other hand, in the horizontal x-y plane, the directivity of the horn will be governed by the phase correction accomplished by the pre-load chamber across the long dimension of the throat opening in conjunction with the geometry of the flared section of the horn and particularly its vertical sidewalls 26.

The flared section 11 and pre-load chamber 14 of horn 10 may be fabricated as one part or two separate parts attached by suitable flanges. The base end of the horn 19 is also suitably provided with a flange (not shown) for attaching the base end of the horn to an acoustical driver mechanism (not shown) such that the sound pressure waves generated by the acoustical driver mechanism are coupled to the pre-load chamber through horn circular opening 16.

The horn's flared section 11 has a mouth end 22, the dimensions of which are chosen to achieve the desired effective low frequency response in both the vertical and horizontal planes. Generally, in each of the horizontal and vertical planes of the horn's polar response, the horn will have an effective frequency response down to a frequency having a wavelength which is equal to the dimension of the mouth end of the horn in that plane divided by 1.15. The horn's flared section includes two flared vertical sidewalls 26 that extend to the mouth of the horn from the long dimension defining edges 15 of the throat opening 13, and two flared horizontal sidewalls 28 that extend to the mouth of the horn from the throat opening's short dimension defining edges 17. For convenience, the sidewalls of the flared section associated with the long dimension of the throat opening, in this case vertical sidewalls 26, can be referred to as "long dimension sidewalls" and the sidewalls associated with the short dimension, i.e. sidewalls 28, can be referred to as "short dimension sidewalls."

In the embodiment of the invention shown in FIGS. 1–3, it has been determined that a narrow coverage horn having a uniform frequency response can be achieved by selecting a flare rate for the vertical sidewalls 26 which consists of two successive exponential curves, and by selecting a flare rate for the horizontal sidewalls 28 that consists of a conical curve and an exponential curve. By combining curves, the overall length of the flared section of the horn will be relatively short.

Now described are the dimensions and parameters for a working embodiment of the narrow coverage version of the horn illustrated in FIGS. 1–3 wherein the horn has a vertical coverage of 40° and a horizontal coverage of 50°. The mouth of the flared section of the narrow coverage version of the horn has a horizontal dimension of 15.66 inches and a vertical dimension of 8.29 inches. The flare rate of the horizontal sidewalls 28, which are characterized by an exponential and a conical curve, are governed by the following two equations where the z dimension is expressed as a function of x:

$$Z_{1a}=0.72(x)+0.8, \text{ for } 0<x<6.3$$

For 6.3<x<8.25, the width $Z_{1b}$ is described by the equation $$Z_{1b}=0.0139\ (e^{.686486x}+250.8)+0.80$$

In the foregoing equations, x=0 denotes the position of the rectangular throat opening 13, and thus it can be seen that the short dimension of the throat opening at x=0 is 0.80 inches. In the vertical plane, the horn will be effective up to a frequency where the wave length is roughly equal to the short dimension of the throat opening.

The vertical sidewalls of the flared section of the horn consist of two exponential curves where the y dimension is expressed as a function of x as follows:

$$y_{1a}=8.66904\ (e^{.0677332(x+4.5)}-0.8270)$$

for 0<x<1.8. Beginning at x=1.8 inches, the equation becomes $$y_{1b}=2.4686\ (e^{.145143(x+4.5)}-0.0185)$$

The resultant long dimension of the throat opening 13 at x=0 is 4.59 inches.

The dimensional characteristics of the pre-load chamber of the working embodiment of the narrow coverage embodiment of the invention (FIGS. 1–3) is described in terms of its changing cross-section along the x-axis between the horn's base end 19 and throat opening 13. The shape of the cross-section of the pre-load chamber is defined by four equal arcs spaced 90 degrees apart which diminish as the pre-load chamber extends toward the throat opening, and by horizontal and vertical line segments that increase in length in the direction of the throat opening. At the circular opening 16 at the base end of the horn, the arcs merge to form a circle, whereas at the throat opening they substantially disappear such that the line segments form a rectangular shape. The pre-load chamber of the working embodiment of the narrow coverage version of the horn can be represented by the following table where "x" represents the x-axis, "A" represents the vertical ("z") dimension at "x," "B" represents the ("y") dimension at "x," and "C" represents the radius of the arcs which join the horizontal and vertical walls at position "x."

| x | A | B | C |
|---|---|---|---|
| −4.50 | 1.50 | 1.50 | .75 |
| −4.00 | 1.42 | 1.80 | .542 |
| −3.50 | 1.34 | 2.11 | .333 |
| −3.00 | 1.27 | 2.43 | .125 |
| −2.50 | 1.19 | 2.76 | .125 |
| −2.00 | 1.11 | 3.10 | .125 |
| −1.50 | 1.03 | 3.45 | .125 |
| −1.00 | .96 | 3.82 | .125 |
| −0.50 | .88 | 4.20 | .125 |
| 0.00 | .80 | 4.59 | .125 |

The second working embodiment of the invention illustrated in FIGS. 4–6 is now described. This embodiment is intended to provide broader coverage in the horizontal x-y plane than the embodiment illustrated in FIGS. 1–3. In this plane, the second described embodiment has a coverage angle of 80° in the horizontal plane and 40° in the vertical.

In the working embodiment illustrated in FIGS. 4–6, the dimensions for the mouth end 22*a* of the flared section of the horn are selected to be 8.365 and 15.23 inches in, respectively, the vertical and horizontal directions. This gives a low end frequency range of 1.8 kHz in the vertical direction and 1.0 kHz in the horizontal direction. In this embodiment, the vertical side walls 26*a* of the flared section have a conical component and an exponential component and the horizontal side walls, which in this case are the long dimension side walls relative to the rectangular throat opening 13*a,* have an exponential curve. The flare rate of the vertical side walls, y expressed as a function of x, is described by the following equation:

$$y_2=0.0042262\ (e^{x}-1)+1.4(x)+0.80$$

The flare rate of the horizontal sidewalls 28*a,* expressed in terms of the z coordinate as a function of x, is in turn described as follows:

$$z_2=1.429\ (e^{.195385(x+2)}+0.04969)$$

The resultant long dimension of throat opening 13*a* at x=0 is 2.18 inches. The resultant short dimension is 0.80 inches.

The pre-load chamber for the working embodiment of the horn illustrated in FIGS. 4–6 can be described in the same manner as the pre-load chamber for the narrow coverage embodiment of FIGS. 1–3. The critical dimensions are shown in the following table where dimension "x" again represents the x axis position, "D" represents the overall vertical ("z") dimension at "x," dimension "E" represents the overall horizontal ("y") dimension at "x," and "F" represents the radius of the arcs which join the horizontal and vertical walls.

| x | D | E | F |
|---|---|---|---|
| −3.00 | 1.50 | 1.50 | .750 |
| −2.50 | 1.50 | 1.44 | .691 |
| −2.00 | 1.50 | 1.25 | .625 |
| −1.50 | 1.65 | .979 | .489 |
| −1.00 | 1.81 | .829 | .393 |
| −0.50 | 1.99 | .800 | .292 |
| 0.00 | 2.18 | .800 | .189 |

In each of the above-described embodiments of the invention, the pre-load chamber is relatively short as measured between the horn's base end 19 and the throat opening 13. In the first embodiment, this distance measures 4.50 inches, whereas in the second embodiment, this distance is 3.0 inches. At these distances, the length of the pre-load chamber will be only a few multiples of the wave length of the highest frequency at which the horn operates. Thus, the opportunity to introduce distortion in the pre-load chamber is minimized.

While the present invention has been described in considerable detail in the foregoing specification, it is understood that it is not intended that the invention be limited to such detail, except as necessitated by the following claims.

What we claim is:

1. In a loudspeaker horn for coupling sound pressure waves generated by an acoustical driver into free space over an operating bandwidth of frequencies, including a high range of operating frequencies having known wavelengths, and for producing a characteristic polar pattern about a radiating axis, and wherein said loudspeaker horn includes an unobstructed throat area having a defined throat opening, a mouth end that is relatively large compared to the throat opening, a flared section extending between the throat opening and the mouth end to provide a transition therebetween, and a pre-load chamber before the throat opening of the horn for coupling acoustical sound waves generated by an acoustical driver to the flared section of the horn, the improvement comprising a pre-load chamber having a length, measured from the acoustical driver to the throat opening of the horn, that is relatively short in relation to multiples of the wavelength of the highest operating frequency of the horn, and having sidewalls formed to correct the phase relationship of the sound pressure waves generated by the acoustical driver across the long dimension of said throat opening to achieve desired directivity in the long dimension plane of the horn's polar pattern.

2. The loudspeaker horn of claim 1 wherein the length of said pre-load chamber is less than approximately five inches.

3. The loudspeaker horn of claim 1 wherein the length of said pre-load chamber is between approximately two inches and five inches.

4. A loudspeaker horn for coupling sound pressure waves generated by an acoustical driver into free space over an operating bandwidth of frequencies including a high range of operating frequencies having known wavelengths and wherein said horn produces a characteristic polar pattern about a radiating axis, said loudspeaker horn comprising an unobstructed throat area having a defined rectangular throat opening characterized by a long dimension relative to the wavelengths of the high range of operating frequencies of the horn and a short dimension relative to the wavelengths of said high range of frequencies, said long dimension being measured between long dimension defining edges of said throat opening and defining a long dimension plane within the polar pattern of the loudspeaker horn, and said short dimension being measured between short dimension defining edges of said throat opening and defining a short dimension plane within said polar pattern, a pre-load chamber for coupling an acoustical driver to the rectangular throat opening of the loudspeaker horn, said pre-load chamber having a length, measured from the acoustical driver to the throat opening of the horn, that is relatively short in relation to multiples of the wavelength of the highest operating frequency of the horn, and being formed to correct the phase relationship of the sound pressure waves generated by the acoustical driver across the long dimension of the rectangular opening of said throat opening to achieve desired directivity in the long dimension plane of the horn's polar pattern, a mouth end having relatively large dimensions as compared to the throat opening of the loudspeaker horn, and a flared section extending between the throat opening and the mouth end of the horn, said flared section having a pair of opposed long dimension side walls extending from the long dimension defining edges of the throat opening of the horn, said long dimension side walls having a characteristic curve which in conjunction with the form of the pre-load chamber is selected to achieve desired directivity of the horn's polar pattern in the long dimension plane, and a pair of opposed short dimension side walls extending from the short dimension defining edges of said throat opening, said short dimension side walls having a characteristic curve selected to achieve desired directivity of the horn's polar pattern in the short dimension plane.

5. The loudspeaker horn of claim 4 wherein the length of said pre-load chamber is less than approximately five inches.

6. The loudspeaker horn of claim 4 wherein the length of said pre-load chamber is between approximately two inches and five inches.

7. The loudspeaker horn of claim 4 wherein said pre-load chamber has long dimension chamber side walls extending to and associated with the long dimension defining edges of said throat opening and short dimension sidewalls extending to and associated with the short dimension defining edges of said throat opening, said long dimension chamber sidewalls having a curvature selected to correct the phase relationship of the sound pressure waves generated by the acoustical driver across the long dimension of said throat opening to achieve desired directivity in the long dimension plane of the horn's polar pattern.

8. The loudspeaker horn of claim 7 wherein the curve of the long dimension sidewalls of the flared section of the horn has an exponential flare rate and the curve of the short dimension sidewalls has a conical flare rate.

9. A loudspeaker horn for coupling sound pressure waves generated by an acoustical driver into free space over an operating bandwidth of frequencies including a high range of operating frequencies having known wavelengths and wherein said horn produces a characteristic polar pattern about a radiating axis, said loudspeaker horn comprising an unobstructed throat area having a defined rectangular throat opening characterized by a long dimension relative to the wavelengths of the high range of operating frequencies of the horn and a short dimension relative to the wavelengths of said high range of frequencies, said long dimension being measured between long dimension defining edges of said throat opening and defining a long dimension plane within the polar pattern of the loudspeaker horn, and said short dimension being measured between short dimension defining edges of said throat opening and defining a short dimension plane within said polar pattern, a pre-load chamber for coupling an acoustical driver to the rectangular throat opening of the loudspeaker horn, said pre-load chamber having a length, measured from the acoustical driver to the throat opening of the horn, that is less than approximately five inches, and being formed to correct the phase relationship of the sound pressure waves generated by the acoustical driver across the long dimension of the rectangular opening of said throat opening to achieve desired directivity in the long dimension plane of the horn's polar pattern, a mouth end having relatively large dimensions as compared to the throat opening of the loudspeaker horn, and a flared section extending between the throat opening and the mouth end of the horn, said flared section having a pair of opposed long dimension side walls extending from the long dimension defining edges of the throat opening of the horn, said long dimension side walls having a characteristic curve providing an exponential flare rate which in conjunction with the form of the pre-load chamber is selected to achieve desired directivity in the horn's polar pattern in the long dimension plane, and a pair of opposed short dimension side walls extending from the short dimension defining edges of said throat opening, said short dimension side walls having a characteristic curve providing a conical flare rate selected to achieve desired directivity of the horn's polar pattern in the short dimension plane.

10. In a loudspeaker horn having a flared section for coupling sound pressure waves generated by an acoustical driver into free space over an operating bandwidth of frequencies including a high range of operating frequencies having known wavelengths and wherein said horn produces a characteristic polar pattern about a radiating axis, a method for controlling the directivity of the polar pattern of said horn over its operating frequency bandwidth comprising providing said horn with an unobstructed throat area having a defined rectangular throat opening characterized by at least one long dimension relative to the wavelengths of the high range of operating frequencies of the horn, said long dimension being measured between long dimension defining edges of said throat opening and defining a long dimension plane within the polar pattern of the loudspeaker horn, passing the sound pressure waves generated by said acoustical driver to the throat opening of said horn through a pre-load chamber having a length, measured from the acoustical driver to the throat opening of the horn, that is relatively short in relation to multiples of the wavelength of the highest operating frequency of the horn, and wherein said pre-load chamber is formed to correct the phase relationship of the sound pressure waves generated by the acoustical driver across the long dimension of said throat opening to achieve desired directivity in the long dimension plane of the horn's polar pattern.

11. The method of claim 10 wherein the sound pressure waves are passed through a pre-load chamber having a length of less than approximately five inches.

12. The method of claim 10 wherein the throat opening of said horn is further provided with a short dimension relative to the wavelengths of the high range of frequencies of the horn's frequency bandwidth wherein the short dimension of said throat opening behaves like a diffraction slot whereby the directivity of the polar pattern of the horn in the plane perpendicular to said long dimension plane is substantially governed by the flare rate of the flared section of the horn while the directivity of the polar pattern of the horn in the long dimension plane is substantially governed by the preconditioning of the sound pressure waves in the pre-load chamber and the flare rate of the flared section of the horn.

* * * * *